United States Patent
Sanchez et al.

(10) Patent No.: US 9,082,684 B2
(45) Date of Patent: Jul. 14, 2015

(54) METHOD OF EPITAXIAL DOPED GERMANIUM TIN ALLOY FORMATION

(71) Applicants: Errol Antonio C. Sanchez, Tracy, CA (US); Yi-Chiau Huang, Fremont, CA (US)

(72) Inventors: Errol Antonio C. Sanchez, Tracy, CA (US); Yi-Chiau Huang, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 101 days.

(21) Appl. No.: 13/784,403

(22) Filed: Mar. 4, 2013

(65) Prior Publication Data

US 2013/0256838 A1    Oct. 3, 2013

Related U.S. Application Data

(60) Provisional application No. 61/619,268, filed on Apr. 2, 2012.

(51) Int. Cl.
| | | |
|---|---|---|
| *H01L 29/161* | (2006.01) | |
| *H01L 21/02* | (2006.01) | |
| *H01L 29/78* | (2006.01) | |
| *H01L 29/165* | (2006.01) | |

(52) U.S. Cl.
CPC .......... *H01L 29/161* (2013.01); *H01L 21/0245* (2013.01); *H01L 21/0251* (2013.01); *H01L 21/0262* (2013.01); *H01L 21/02381* (2013.01); *H01L 21/02452* (2013.01); *H01L 21/02532* (2013.01); *H01L 21/02535* (2013.01); *H01L 21/02576* (2013.01); *H01L 21/02579* (2013.01); *H01L 21/02636* (2013.01); *H01L 29/165* (2013.01); *H01L 29/7848* (2013.01)

(58) Field of Classification Search
CPC . H01L 29/161; H01L 29/165; H01L 29/1054; H01L 29/02381; H01L 29/02532
USPC .......................................... 257/616; 438/478
See application file for complete search history.

(56) References Cited

U.S. PATENT DOCUMENTS

| | | | |
|---|---|---|---|
| 5,013,681 | A | 5/1991 | Godbey et al. |
| 5,548,128 | A | 8/1996 | Soref et al. |
| 6,037,614 | A | 3/2000 | He et al. |
| 6,982,433 | B2 | 1/2006 | Hoffman et al. |
| 7,452,764 | B2 | 11/2008 | Hoffmann et al. |
| 2006/0134895 | A1 | 6/2006 | Kouvetakis et al. |
| 2008/0163813 | A1 | 7/2008 | Zollner et al. |
| 2008/0171425 | A1 | 7/2008 | Poplavskyy et al. |
| 2010/0193882 | A1 | 8/2010 | Hoentschel et al. |
| 2012/0025212 | A1 | 2/2012 | Kouvetakis et al. |
| 2012/0184088 | A1* | 7/2012 | Vincent et al. ................. 438/478 |
| 2014/0020619 | A1* | 1/2014 | Vincent et al. ................. 117/88 |

FOREIGN PATENT DOCUMENTS

| | | |
|---|---|---|
| JP | 2007-294778 | 11/2007 |
| KR | 2011-0025075 | 3/2011 |

OTHER PUBLICATIONS

International Search Report for Related Application PCT/US2013/033743.

* cited by examiner

*Primary Examiner* — Matthew W Such
*Assistant Examiner* — Warren H Kilpatrick
(74) *Attorney, Agent, or Firm* — Patterson & Sheridan, LLP

(57) ABSTRACT

A method for forming germanium tin layers and the resulting embodiments are described. A germanium precursor and a tin precursor are provided to a chamber, and an epitaxial layer of germanium tin is formed on the substrate. The germanium tin layer is selectively deposited on the semiconductor regions of the substrate and can include thickness regions of varying tin and dopant concentrations. The germanium tin layer can be selectively deposited by either alternating or concurrent flow of a halide gas to etch the surface of the substrate.

18 Claims, 3 Drawing Sheets

… (0)

METHOD OF EPITAXIAL DOPED GERMANIUM TIN ALLOY FORMATION

CROSS-REFERENCE TO RELATED APPLICATIONS

This application claims benefit of U.S. Provisional Patent Application Ser. No. 61/619,268 (APPM/17138L), filed Apr. 2, 2012, which is herein incorporated by reference.

BACKGROUND OF THE INVENTION

1. Field of the Invention

Technology described herein relates to manufacture of semiconductor devices. More specifically, methods are described of forming field effect transistors using group IV alloy materials.

2. Description of the Related Art

Germanium was one of the first materials used for CMOS transistors. Due to vast abundance of silicon compared to germanium, however, silicon has been the overwhelming semiconductor material of choice for CMOS manufacture. As device geometries decline according to Moore's Law, the size of transistor components poses challenges to engineers working to make devices that are smaller, faster, use less power, and generate less heat. For example, as the size of a transistor declines, the channel region of the transistor becomes smaller, and the electronic properties of the channel become less viable, with more resistivity and higher threshold voltages.

Carrier mobility is increased in the silicon channel area by using silicon-germanium stressors embedded in the source/drain areas, which enhances the intrinsic mobility of silicon. For future nodes, however, still higher mobility devices are needed.

Switching to higher mobility materials than silicon, such as germanium for pMOSFETs, has been suggested. However, the mobility of germanium is not superior to strained silicon, unless the germanium is also strained. It has been recently discovered that germanium tin (GeSn) grown on the source drain region has the requisite strain for making a superior germanium pMOSFET channel, which takes advantage of the germanium/GeSn lattice mismatch.

Conductivity across one or stacks of material structures is an important facet of CMOS formation. Overall conductivity is a function of carrier mobility, carrier concentration, and band alignment between materials. GeSn is attractive in these aspects. High carrier mobility layers will benefit more from increased carrier concentration than low mobility layers. Doping is one means to increase carrier concentration, however the methods of doping a GeSn layer have not been disclosed in the art. Thus, there is a continuing need for methods and apparatus to selectively form high mobility semiconductor devices as well as manipulate the related conductivity.

SUMMARY OF THE INVENTION

Method and apparatus for forming conductive layers on a semiconductor substrate are provided. In one embodiment, a GeSn layer may be selectively formed on semiconductor surfaces of a substrate by positioning a substrate having both dielectric and semiconductor surfaces in a processing chamber, co-flowing a germanium hydride precursor, a tin precursor and a dopant into the processing chamber, epitaxially growing a GeSn layer until the desired layer thickness is reached, flowing an etchant comprising a halogen gas into the processing chamber, and repeating the epitaxial growth and etch steps until a GeSn layer of the desired overall thickness is selectively grown on non-dielectric surfaces. The tin precursor and dopant flow may be varied during the growth sequence. The flowing of the etchant can also comprise flowing the dopant and tin precursor to reduce loss of dopant and tin.

In another embodiment, a GeSn layer may be selectively formed on semiconductor surfaces of a substrate by positioning a substrate with both dielectric and semiconductor surfaces in a processing chamber, co-flowing a germanium hydride precursor, a tin precursor, an etchant comprising a halogen gas and the dopant into the processing chamber, and epitaxially growing a GeSn layer until the desired overall thickness is grown, wherein the etchant will prevent growth of GeSn on dielectric layers. The tin precursor and dopant flow may be varied during the deposition.

The germanium precursor may be a hydride, and the tin precursor may be a tin halide. An etchant, for example a halide gas, may be included with the reaction mixture to control deposition selectivity on semiconductive and dielectric regions of the substrate.

One or more embodiments can include a semiconductor substrate with an upper surface with both dielectric and semiconductor regions, and a doped crystalline germanium tin layer deposited on the upper surface, where the tin and dopant concentrations vary in certain regions within the layer.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
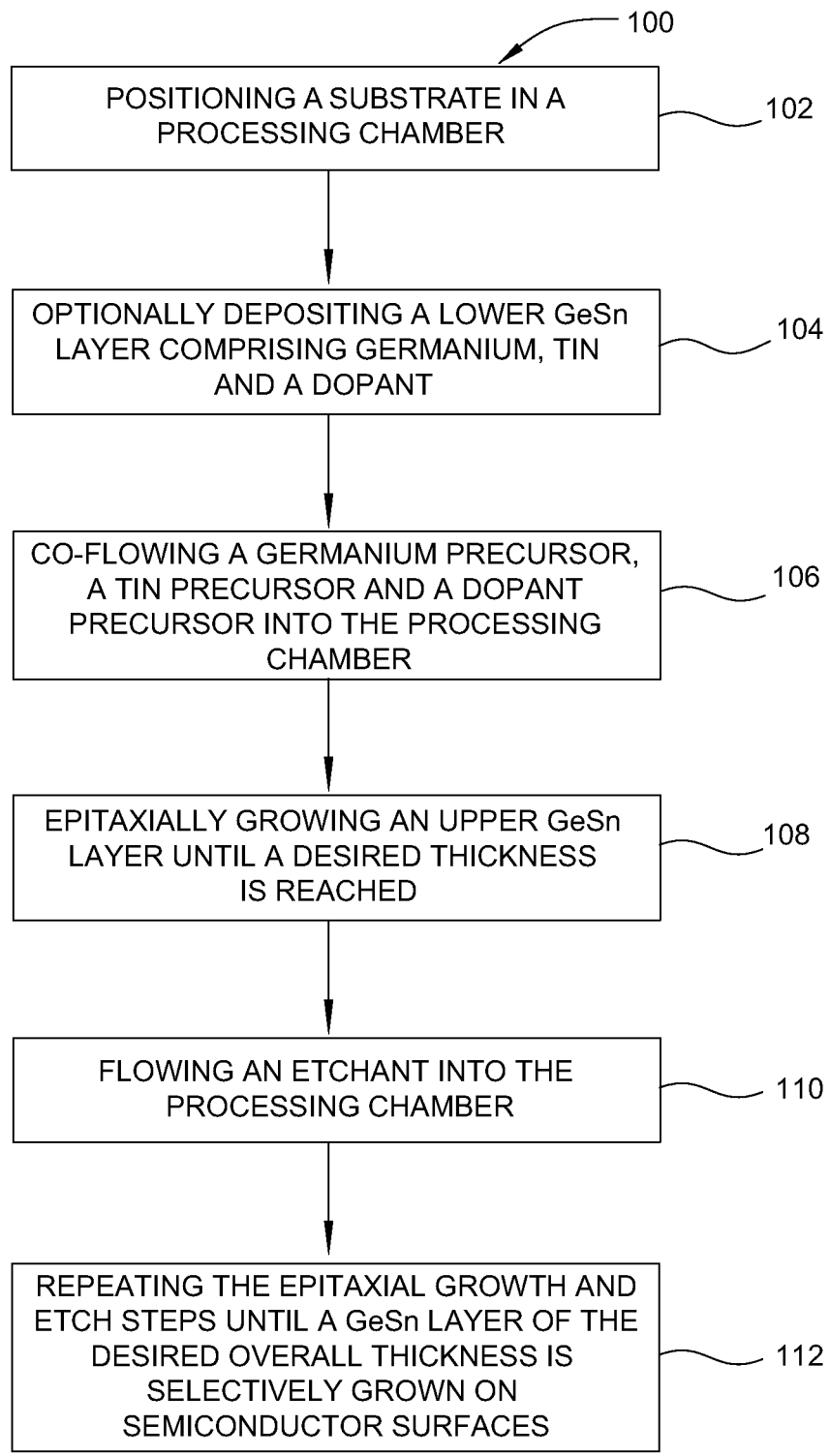
FIG. 1 is a flow diagram summarizing a method according to one embodiment.

FIG. 1 is a flow diagram of method 100 according to one or more embodiments. A semiconductor substrate is positioned in a processing chamber at step 102. The semiconductor substrate may be any semiconductive material on which a stressor layer is to be formed, such as silicon or germanium. A silicon substrate on which a transistor structure is to be formed may be used in one example. The silicon substrate may have dielectric areas formed on a surface thereof in some embodiments. For example, the silicon substrate may have transistor gate structures and dielectric spacers formed adjacent to semiconductive source/drain regions, which may be regions of doped silicon or regions on which source/drain materials and contacts are to be formed. Thus, the source/ drain regions may comprise the GeSn layers described herein in addition to, or instead of, doped silicon or germanium layers.

The embodiments described herein typically comprise a GeSn layer which has been doped to control conductivity. The conductivity of the GeSn layer may be controlled at low tin concentrations by varying the concentration of tin incorporated in the GeSn matrix. However the GeSn layer is still in a relatively low conductivity state. Doping the GeSn layer provides additional charge carriers to the material. The dopant atoms provide the semiconductor with either free electrons in the conduction band or electron vacancies (or holes) in the valence band, both of which provide the semiconductor with higher conductance, which is useful for production of CMOS features.

A lower GeSn layer may be deposited as for example in step 104 with different thickness regions such as to have a variation in concentration at the region near the semiconductor interface. The tin and dopant concentrations of GeSn layer can be tailored to a desired concentration which can vary at different thickness regions formed between the semiconductor interface and the surface of the GeSn layer, resulting in a gradient-like concentration of tin and/or dopant or other sequence of variation within the GeSn layer. Thus, the lower GeSn layer, while primarily composed of germanium, tin and dopant, could be distinct from the upper GeSn layer. In this example, the formation of the germanium layer can begin by flowing the germanium precursor. The germanium precursor is typically a germanium hydride, such as digermane ($Ge_2H_6$), or higher hydrides ($Ge_xH_{2x+2}$), or combinations thereof. The germanium precursor may be mixed with a carrier gas, which may be a non-reactive gas such as nitrogen gas, hydrogen gas, or a noble gas such as helium or argon, or a combination thereof.

A tin precursor is provided to the processing chamber simultaneously with the germanium precursor to react with the germanium precursor and deposit a graded layer of tin doped germanium. The tin precursor may be a tin halide gas, for example $SnCl_4$, $SnCl_2$, or an organotin chloride having the formula $R_xSnCl_y$, where R is methyl or t-butyl, x is 1 or 2, and y is 2 or 3, such that the formed layer is composed primarily of germanium and tin. The composition of the layer can begin by flowing only the germanium precursor to create an initial portion of the layer entirely of germanium with little or no tin. The flow of tin can be progressively increased leading to an increasing concentration of tin in the upper portion of the final GeSn layer. The lower GeSn layer can lead to both better binding of the GeSn layer and better electron mobility over the use of a GeSn layer alone.

The dopant in the GeSn layer can be selected from p-type or n-type dopants such as boron, phosphorus or arsenic delivered through precursors such as diborane ($B_2H_6$), phosphine ($PH_3$), and/or arsine ($AsH_3$). The dopant can be co-flown into the chamber with the germanium precursor and the tin precursor either at a constant rate or at a graded rate similar to the delivery of tin. Further, the gradient of tin and/or the dopant can be manipulated to reach a final concentration of both tin and dopant which reflects the concentration of tin and dopant in one or more layers deposited after that distinct thickness region such as the thin lower GeSn layer.

The germanium precursor, tin precursor and the dopant can be simultaneously flown into the processing chamber at step 106. The germanium precursor, the tin precursor and the dopant may be selected from the same group as disclosed for the lower GeSn layer but they need not be the same precursor. The ratio of germanium precursor volumetric flow rate to carrier gas flow rate may be used to control gas flow velocity through the chamber. The ratio may be any proportion from about 1% to about 99%, depending on the flow velocity desired. In some embodiments, a relatively high velocity may improve uniformity of the formed layer. In a 300 mm single-wafer embodiment, the flow rate of germanium precursor may be between about 0.1 sLm and about 2.0 sLm. For a chamber having a volume of about 50 L, at the above flow rates for germanium precursor, carrier gas flow rate between about 5 sLm and about 40 sLm provides a uniform layer thickness. The tin precursor can be co-flown into the chamber with the germanium precursor to epitaxially grow the GeSn layer.

The tin precursor is provided to the processing chamber at a flow rate between about 10 sccm and about 300 sccm, such as between about 50 sccm and about 200 sccm, for example about 100 sccm. The tin precursor may also be mixed with a carrier gas to achieve a desired space velocity and/or mixing performance in the processing chamber. The tin precursor may be sourced from a liquid or solid source of tin halide vaporized into a flowing carrier gas stream such as $N_2$, $H_2$, Ar, or He, or the tin precursor may be generated by passing a halogen gas, optionally with one of the above carrier gases, over a solid metal in a contacting chamber to perform the reaction $Sn+2Cl_2 \rightarrow SnCl_4$. Either the bubbler or contacting chamber may be adjacent to the processing chamber, coupled thereto by a conduit which is preferably short to reduce the possibility of tin precursor particles depositing in the conduit.

Growth of the GeSn layer is generally epitaxial for high structural quality. Pressure in the processing chamber is maintained between about 5 Torr and about 200 Torr, such as between about 20 Torr and about 200 Torr, with preferred embodiments between about 20 Torr and about 80 Torr. Temperature can be kept from about 250° C. to about 500° C., such as from about 300° C. to about 450° C., for example about 300° C. Temperatures are kept low to avoid tin segregation in the layer, generally below 400 C. Pressures may be below about 5 Torr in some embodiments, but reduced pressure also reduces deposition rate. Deposition rate at these conditions is between about 50 Å/min and about 500 Å/min.

An upper GeSn layer is epitaxially grown to a desired thickness at step 108, according to the following reactions:

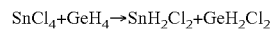

$$SnCl_4+GeH_4 \rightarrow SnH_2Cl_2+GeH_2Cl_2$$

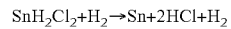

$$SnH_2Cl_2+H_2 \rightarrow Sn+2HCl+H_2$$

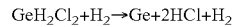

$$GeH_2Cl_2+H_2 \rightarrow Ge+2HCl+H_2$$

Similar reactions occur with the organotin chlorides described above. Higher order germanes yield a mix of chlorogermane intermediates, which similarly resolve into germanium tin deposits. Hydrogen gas may be provided to the chamber to facilitate the deposition reactions. A flow rate of hydrogen gas from about 5 sLm to about 40 sLm may be included with any or all of the precursors to provide an ambient hydrogen concentration.

The upper GeSn layer is typically deposited to a thickness from about 100 Å to about 800 Å. In the embodiments described here, concentration of tin atoms in a germanium matrix may be from 0.5 atomic % to 12 atomic %, such as 3 atomic % to 9 atomic %, for example about 6 atomic %, according to the method 100. Similar to controlling the concentrations of tin, the concentrations of the dopant can be controlled to maintain either specific dopant concentrations or to introduce the dopant at a specific level of the GeSn layer. Standard embodiments include doping with boron using diborane as a precursor, with final concentrations of boron from $5^{19}$ to $1^{21}$ atoms per $cm^3$.

A thickness region of distinct tin and dopant concentration profile may again be grown anywhere within the upper GeSn layer, similar to the lower GeSn layer but farther from the substrate interface. In some embodiments, a region near the surface of the GeSn layer farthest from the substrate can show a concentration variation.

An etchant can be flown into the processing chamber at step 110. The etchant is provided to control deposition of germanium and tin on the surface of the substrate. The etchant selectively removes deposited species from the dielectric regions of the substrate faster than from the semiconductive regions. Thus, the etchant may be a selectivity control species because in some embodiments selectivity may be controlled by adjusting the amount of the etchant relative to the reactive species in the reaction mixture. The dopant and tin precursor can be included with the flow of the etchant to reduce loss of tin and dopant.

The etchant is typically a halogen containing species, such as a halide, for example HCl, HF, or HBr. In one embodiment, the etchant can be chlorine or HCl. The etchant may be provided at a flow rate between about 10 sccm and about 1000 sccm, such as between about 100 sccm and about 500 sccm, for example about 200 sccm.

The epitaxial growth and etch steps may be repeated to grow a GeSn layer of the desired thickness at step 112. As stated earlier, the etchant etches dielectric regions preferentially over semiconductor regions. However, as the process is not completely selective, some depletion of the layer over the semiconductor region can occur. As such, it may be beneficial to grow thinner layers, such as layers which are 500 Å or less, and then etch to remove the layers from the dielectric regions when selectively depositing by this method. It is important to note that conditions do not need to remain constant between deposition and etching steps. As such, etching should be optimized at both temperature and pressure based on the choice of etchant, thickness of the layer and germanium to tin ratio.

Figure 2:
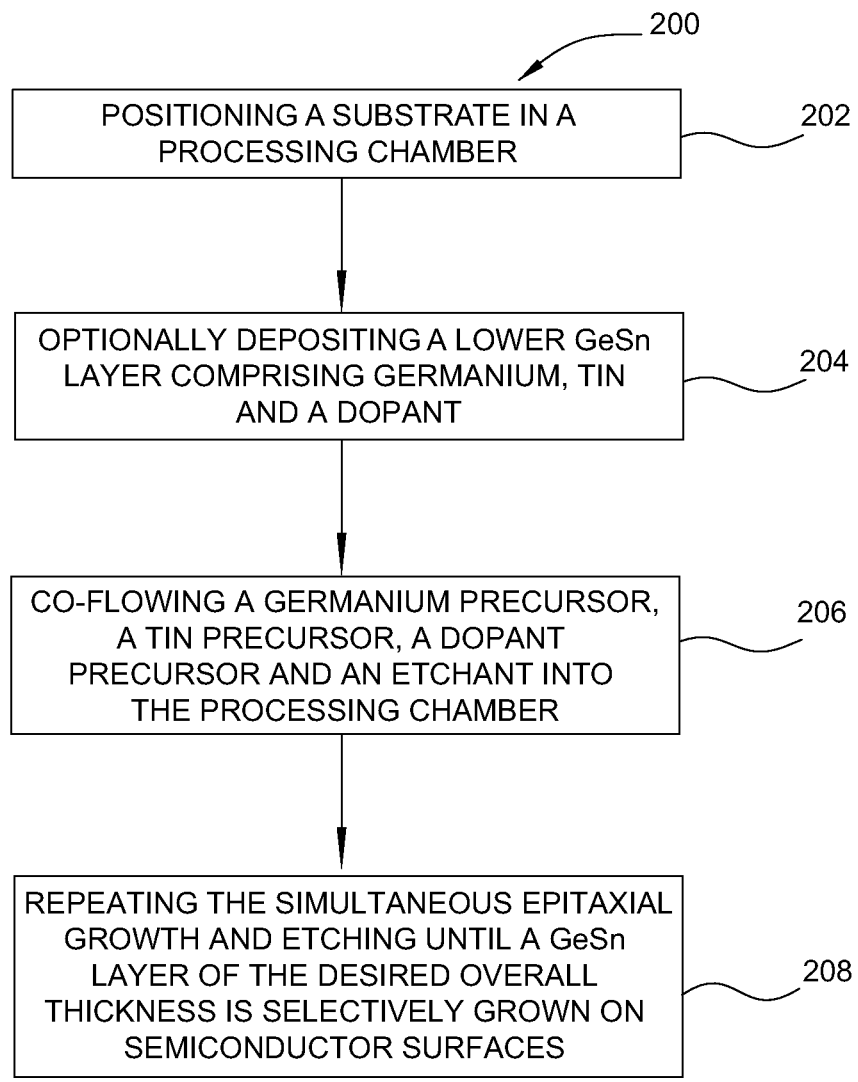
FIG. 2 is a flow diagram summarizing a method according to another embodiment.

FIG. 2 is a flow diagram summarizing a method 200 according to another embodiment. The method 200 is similar in many respects to the method 100, and may be used to achieve similar results when processing substrates having semiconductive and dielectric regions. At step 202, a substrate having semiconductive and dielectric features is disposed in a processing chamber with characteristics as described above in connection with FIG. 1.

At step 204, the germanium precursor, tin precursor, the etchant and the dopant can be simultaneously flown into the processing chamber to deposit the lower GeSn layer. The germanium precursor, the tin precursor, the etchant and the dopant, which may be any of the respective precursors described in connection with FIG. 1, are provided to the processing chamber. As stated earlier, the tin and the dopant can vary as described with reference to FIG. 1.

At step 206, the germanium precursor, tin precursor, the etchant and the dopant can be simultaneously flown into the processing chamber. The germanium precursor, the tin precursor, the etchant and the dopant, which may be any of the respective precursors described in connection with FIG. 1, are provided to the processing chamber. The germanium precursor and the tin precursor can be introduced separately into the processing chamber and mixed therein to prevent deposition prior to meeting the substrate surface.

The GeSn layer can be epitaxially grown to a desired thickness at step 208. Layer growth selectivity and deposition rate may be controlled by adjusting a volumetric ratio of etchant to germanium precursor. A higher ratio reduces deposition rate overall, but improves selectivity. The range of this volumetric flow ratio depends on the temperature, pressure, and specific sources used. At the upper end of the range, the deposition rate is about 50 Å/min, while at the low end of the range the deposition rate is about 500 Å/min. However, at the upper end of the range, film growth on dielectric regions of the substrate is not observed, while at the lower end of the range, the deposition rate on the semiconductive regions is about 50 times the deposition rate on the dielectric regions.

The conductivity of the GeSn layer may be controlled at low tin concentrations by varying the concentration of tin incorporated in the GeSn matrix. The tin concentration may be controlled by adjusting a ratio of tin precursor to germanium precursor in the reaction mixture. In one or more embodiments, the ratio of volumetric flow rates of the tin precursor to the germanium precursor provided to the processing chamber will be between about 0.1% and about 2%, such as between about 0.4% and about 1%, for example about 0.6%. This ratio may be varied at certain times during the deposition as to create thickness regions of varying tin concentration within the GeSn layer. In some embodiments, a region near the upper surface of the GeSn layer, which is the surface farthest from the substrate, can show this concentration variation.

Figure 3:
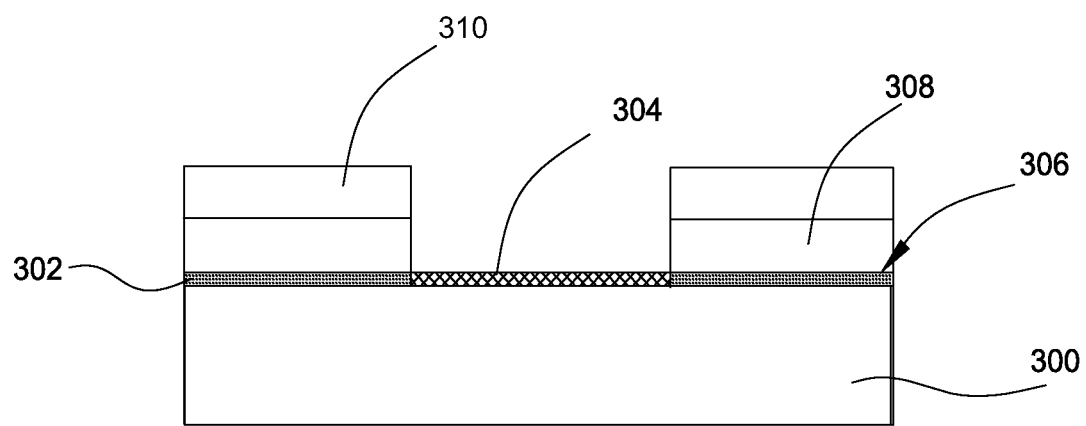
FIG. 3 depicts a substrate formed by the methods described above including selective deposition on source/drain regions.

FIG. 3 depicts a device formed by the methods described above including selective deposition on semiconductor regions of a substrate 300. The substrate 300 can be composed of any available semiconductor material, such as composites of germanium or silicon. The substrate 300 can have semiconductor regions 302, which may be regions of doped silicon, or regions on which source/drain materials are to be formed, and dielectric regions 304, such as regions that have transistor gate structures and dielectric spacers, isolations, or hardmasks formed on the surface.

A doped crystalline GeSn layer, including a lower GeSn layer 308 and an upper GeSn layer 310 may be formed on the upper surface of the semiconductor region 306. The doped GeSn layer may be formed on top of preexisting source/drain materials, such as p-doped silicon, silicon germanium, or germanium layers. The doped crystalline GeSn layer may have varying concentrations of tin, either between the upper GeSn layer 310 and the lower GeSn layer 308 or at different regions of either layer, as disclosed earlier and can be doped as earlier described. The dopant may be selected from available dopants for source/drains regions in CMOS features, such as boron, phosphorus or arsenic. The GeSn layers 308 and 310 can be selectively deposited on the semiconductor regions and not the dielectric regions, for the formation of high electron and hole mobility layers on source/drain regions or in channel regions on the substrate. Other layers may be deposited on the surface of the GeSn layer to form further structures, such as a germanium layer, a dielectric insulator, or a metal.

The doped GeSn layer may have a distinct thickness region of varying tin and dopant concentration such as the lower GeSn layer 308 disposed on the semiconductor regions 302. The lower GeSn layer 308 can be thinner than 10 nm and may have a gradation in tin concentration as measured from the substrate interface to the upper surface of the lower GeSn layer 308. The distinct region of varying tin and dopant concentration can be anywhere within the thickness of the GeSn layer.

A method for forming GeSn layers and the resulting embodiments are described herein. A germanium precursor and a tin precursor are provided to a chamber, and an epitaxial layer of GeSn is formed on the substrate. The GeSn layer is selectively deposited on the semiconductor regions of the substrate and can include thickness regions of varying tin and dopant concentrations. The GeSn layer can be selectively deposited by either alternating or concurrent flow of a halide gas to etch the surface of the substrate or to selectively control deposition of the GeSn layer on the substrate surface.

While the foregoing is directed to embodiments of the invention, other and further embodiments of the invention may be devised without departing from the basic scope thereof.

What is claimed is:

1. A method of selectively forming doped GeSn layers on a substrate, sequentially comprising:
   positioning a substrate in a processing chamber, wherein the substrate comprises both dielectric and non-dielectric surfaces;
   co-flowing a germanium hydride precursor, a tin precursor and a dopant into the processing chamber, the germanium hydride precursor having a general formula of $Ge_nH_{2n+2}$, wherein n is greater than one, to epitaxially grow a GeSn layer until a desired layer thickness is reached;
   flowing an etchant comprising a halide gas into the processing chamber; and
   repeating the co-flowing and the flowing an etchant until a GeSn stack of a desired stack thickness is selectively grown on the non-dielectric surfaces.

2. The method of claim 1, wherein the pressure is maintained between 20 torr and 200 torr.

3. The method of claim 1, wherein the GeSn stack comprises at least a first GeSn layer and a second GeSn layer wherein the first GeSn layer has a concentration of tin, dopant or both which is higher than a concentration of tin, dopant or both in the second GeSn layer.

4. The method of claim 1, wherein each of the GeSn layers contain tin at concentrations between 0.5 atomic % and 12 atomic %.

5. The method of claim 1, wherein the dopant is composed of one or more of either diborane ($B_2H_6$), phosphine ($PH_3$), or arsine ($AsH_3$).

6. The method of claim 1, further comprising varying the flow of the tin precursor and the dopant such that a concentration gradient is created in the GeSn layer.

7. The method of claim 1, wherein the temperature is maintained from about 300° C. to about 450° C.

8. The method of claim 1, wherein the flowing of the etchant also comprises flowing a second dopant and a second tin precursor.

9. A method of selectively forming doped GeSn layers on a substrate, sequentially comprising:
   positioning the substrate in a processing chamber;
   co-flowing a germanium hydride precursor, a tin precursor and a dopant into the processing chamber, the germanium hydride precursor having a general formula of $Ge_nH_{2n+2}$, wherein n is greater than one, to epitaxially grow a GeSn layer using the germanium hydride precursor, the tin precursor and the dopant until a desired layer thickness is reached; and
   flowing an etchant comprising a halide gas into the processing chamber.

10. The method of claim 9, wherein the pressure is maintained between 20 torr and 200 torr.

11. The method of claim 9, further comprising varying the flow of the tin precursor and the dopant such that a concentration gradient is created in the GeSn layer.

12. The method of claim 9, wherein the GeSn layer contains tin at concentrations between 0.5 atomic % and 12 atomic %.

13. The method of claim 9, wherein the dopant is composed of one or more of either diborane ($B_2H_6$), phosphine ($PH_3$), or arsine ($AsH_3$).

14. The method of claim 9, wherein the temperature is maintained from about 300° C. to about 450° C.

15. The method of claim 9, further comprising varying the flow of the tin precursor and the dopant.

16. A semiconductor substrate comprising: an upper surface with both a dielectric region and a semiconductor region; a doped germanium tin layer deposited on the semiconductor region, the doped germanium tin layer having a concentration of tin which varies within the doped germanium tin layer, the concentration of tin creating a gradient in at least a portion of the doped germanium tin layer, wherein the variation in the concentration of tin is limited to a thickness region near the interface between substrate and the germanium tin layer.

17. A semiconductor substrate comprising: an upper surface with both a dielectric region and a semiconductor region; a doped germanium tin layer deposited on the semiconductor region, the doped germanium tin layer having a concentration of tin which varies within the doped germanium tin layer, the concentration of tin creating a gradient in at least a portion of the doped germanium tin layer, wherein the variation in the concentration of tin is limited to a thickness region farthest from the interface between substrate and the germanium tin layer.

18. A semiconductor substrate comprising: an upper surface with both a dielectric region and a semiconductor region; a doped germanium tin layer deposited on the semiconductor region, the doped germanium tin layer having a concentration of tin which varies within the doped germanium tin layer, the concentration of tin creating a gradient in at least a portion of the doped germanium tin layer, wherein the variation in the concentration of tin is limited to a first thickness region closest to the interface between the substrate and the germanium tin layer and a second thickness region farthest from the interface between the substrate and the germanium tin layer.

\* \* \* \* \*